US009887676B2

(12) United States Patent
Moriya et al.

(10) Patent No.: US 9,887,676 B2
(45) Date of Patent: Feb. 6, 2018

(54) HIGH FREQUENCY SEMICONDUCTOR AMPLIFIER

(71) Applicant: Kabushiki Kaisha Toshiba, Minato-ku (JP)

(72) Inventors: Osamu Moriya, Yokohama (JP); Tomohiro Senju, Ota (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/407,436

(22) Filed: Jan. 17, 2017

(65) Prior Publication Data
US 2017/0373652 A1    Dec. 28, 2017

(30) Foreign Application Priority Data
Jun. 23, 2016    (JP) .................................. 2016-124418

(51) Int. Cl.
*H01L 23/00* (2006.01)
*H03F 3/195* (2006.01)
*H01L 23/66* (2006.01)

(52) U.S. Cl.
CPC ............ *H03F 3/195* (2013.01); *H01L 23/66* (2013.01); *H03F 2200/447* (2013.01)

(58) Field of Classification Search
CPC ...................................................... H01L 23/66
See application file for complete search history.

(56) References Cited

U.S. PATENT DOCUMENTS

| 4,427,991 A | * | 1/1984 | Yamamura | ............ | H01L 23/047 |
| | | | | | 257/664 |
| 2003/0006847 A1 | * | 1/2003 | Nelson | .................. | H01L 27/088 |
| | | | | | 330/307 |

FOREIGN PATENT DOCUMENTS

JP    4-321308    11/1992

* cited by examiner

*Primary Examiner* — William Harriston
(74) *Attorney, Agent, or Firm* — Oblon, McClelland, Maier & Neustadt, L.L.P.

(57) ABSTRACT

A high frequency semiconductor amplifier includes a package base part, and a monolithic microwave integrated circuit. The package base part includes a metal plate provided with an attachment hole, a frame body bonded to the metal plate and provided with an opening, a first lead part, and a second lead part. The monolithic microwave integrated circuit is provided with a first amplification element and a second amplification element. An output electrode of the second amplification element is connected to the second lead part via an output combiner. Each finger electrode of the second amplification element is generally orthogonal to the first line. Each finger electrode of the first amplification element is generally parallel to the first line. The attachment hole of the metal plate is provided in a region lying along a second line generally orthogonal to the first line and protruding outside the frame body.

16 Claims, 4 Drawing Sheets

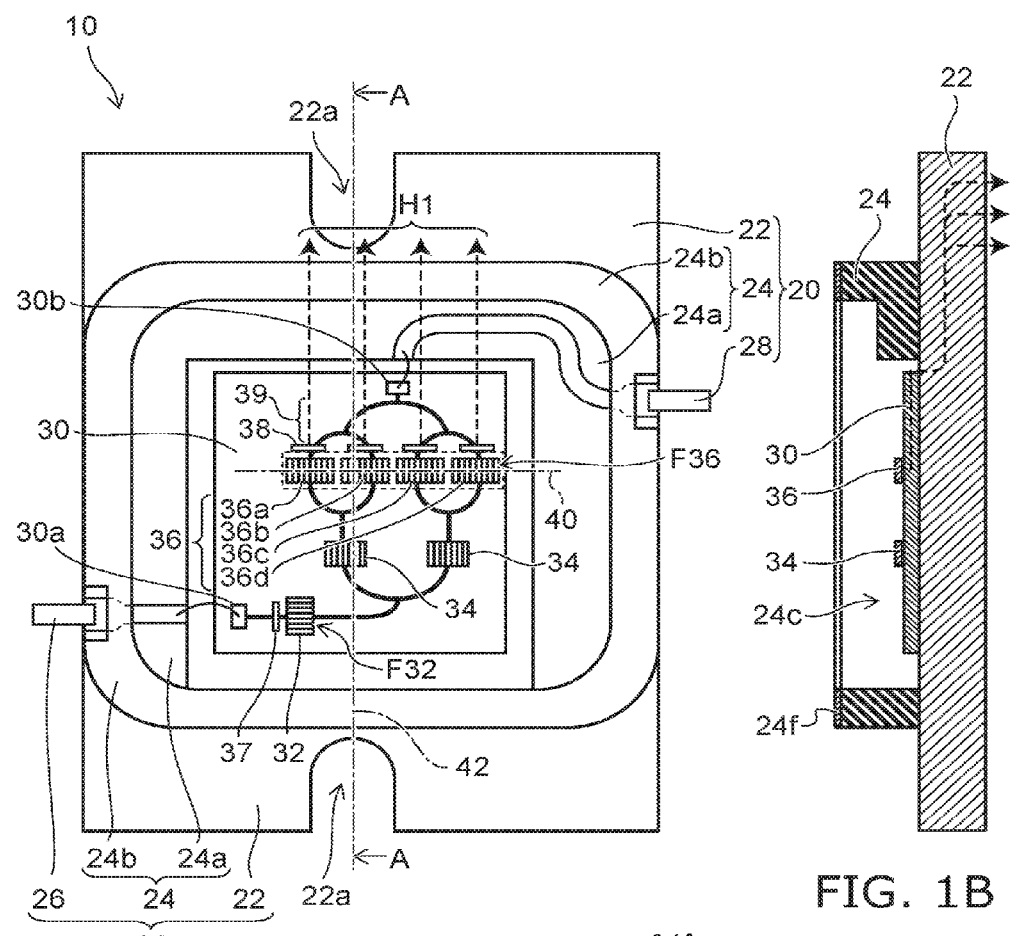
FIG. 1A
FIG. 1B
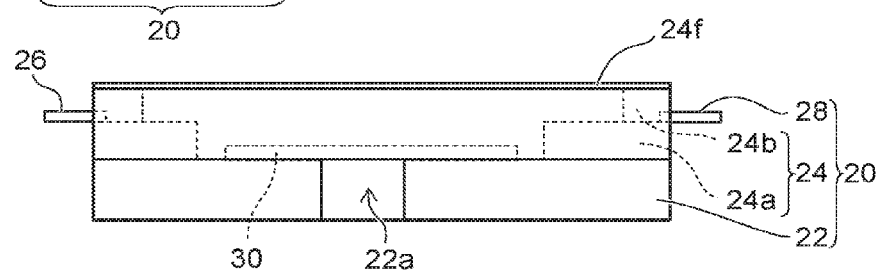
FIG. 1C

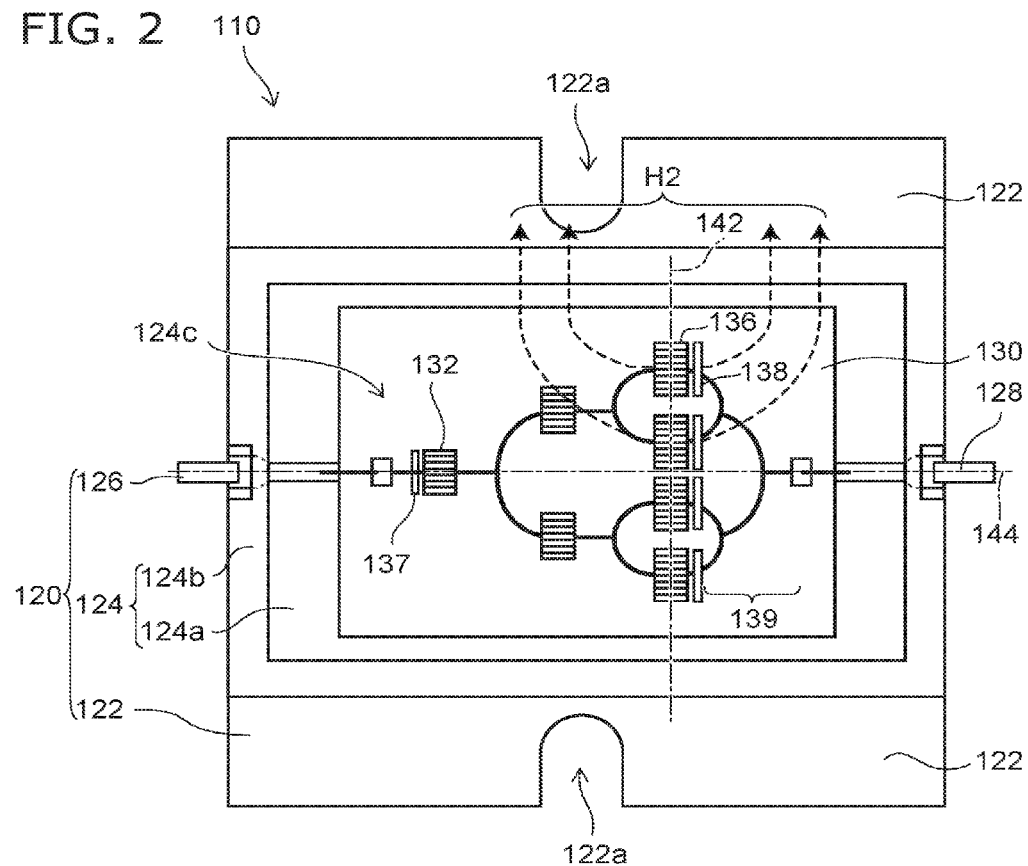
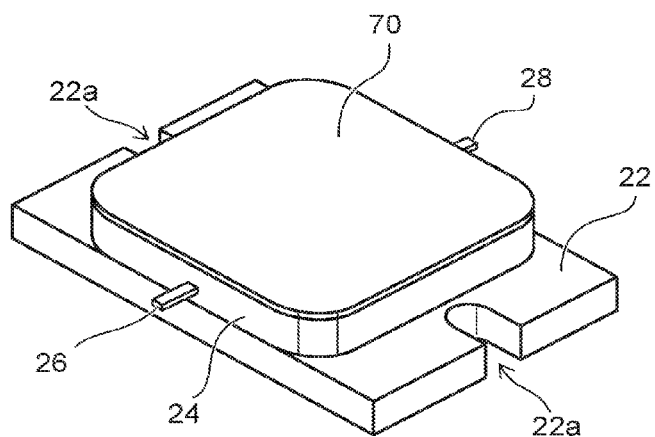

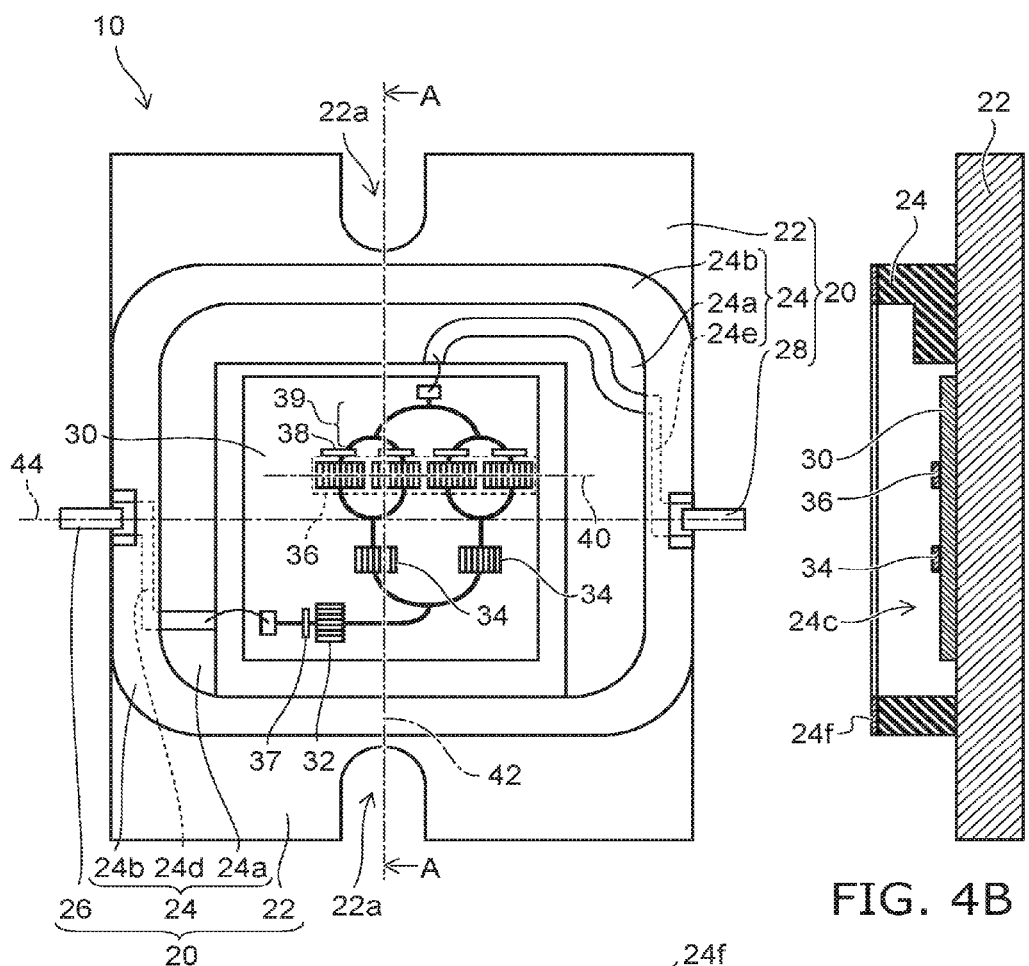
FIG. 4A
FIG. 4B
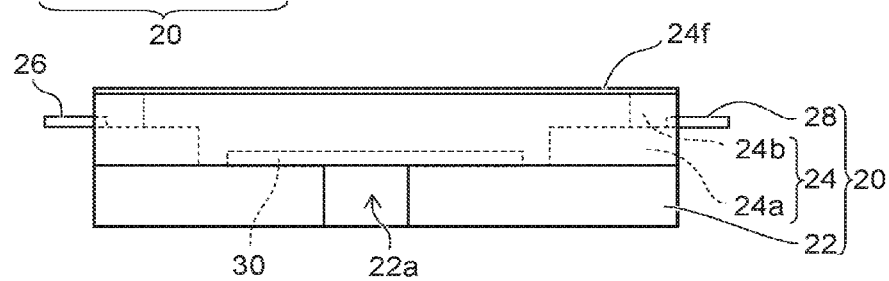
FIG. 4C

HIGH FREQUENCY SEMICONDUCTOR AMPLIFIER

CROSS-REFERENCE TO RELATED APPLICATIONS

This application is based upon and claims the benefit of priority from Japanese Patent Application No. 2016-124418, filed on Jun. 23, 2016; the entire contents of which are incorporated herein by reference.

FIELD

Embodiments described herein relate generally a high frequency semiconductor amplifier.

BACKGROUND

In an MMIC (monolithic microwave integrated circuit) amplifier, the final-stage amplification element generates a large amount of heat due to its high output power.

The final-stage amplification element may be implemented as a multi-cell region to perform parallel operation. In this case, heat dissipation performance may be insufficient depending on the multi-cell arrangement.

BRIEF DESCRIPTION OF THE DRAWINGS

FIG. 1A is a schematic plan view of a high frequency semiconductor amplifier according to a first embodiment, and FIG. 1B is a schematic sectional view taken along line A-A. FIG. 1C is a schematic front view;

FIG. 2 is a schematic plan view of a high frequency semiconductor amplifier according to a comparative example;

FIG. 3 is a schematic perspective view in which the package base part is bonded to a lid part;

FIG. 4A is a schematic plan view of a high frequency semiconductor amplifier according to a second embodiment, FIG. 4B is a schematic sectional view taken along line A-A, and FIG. 4C is a schematic front view.

DETAILED DESCRIPTION

Figure 5:
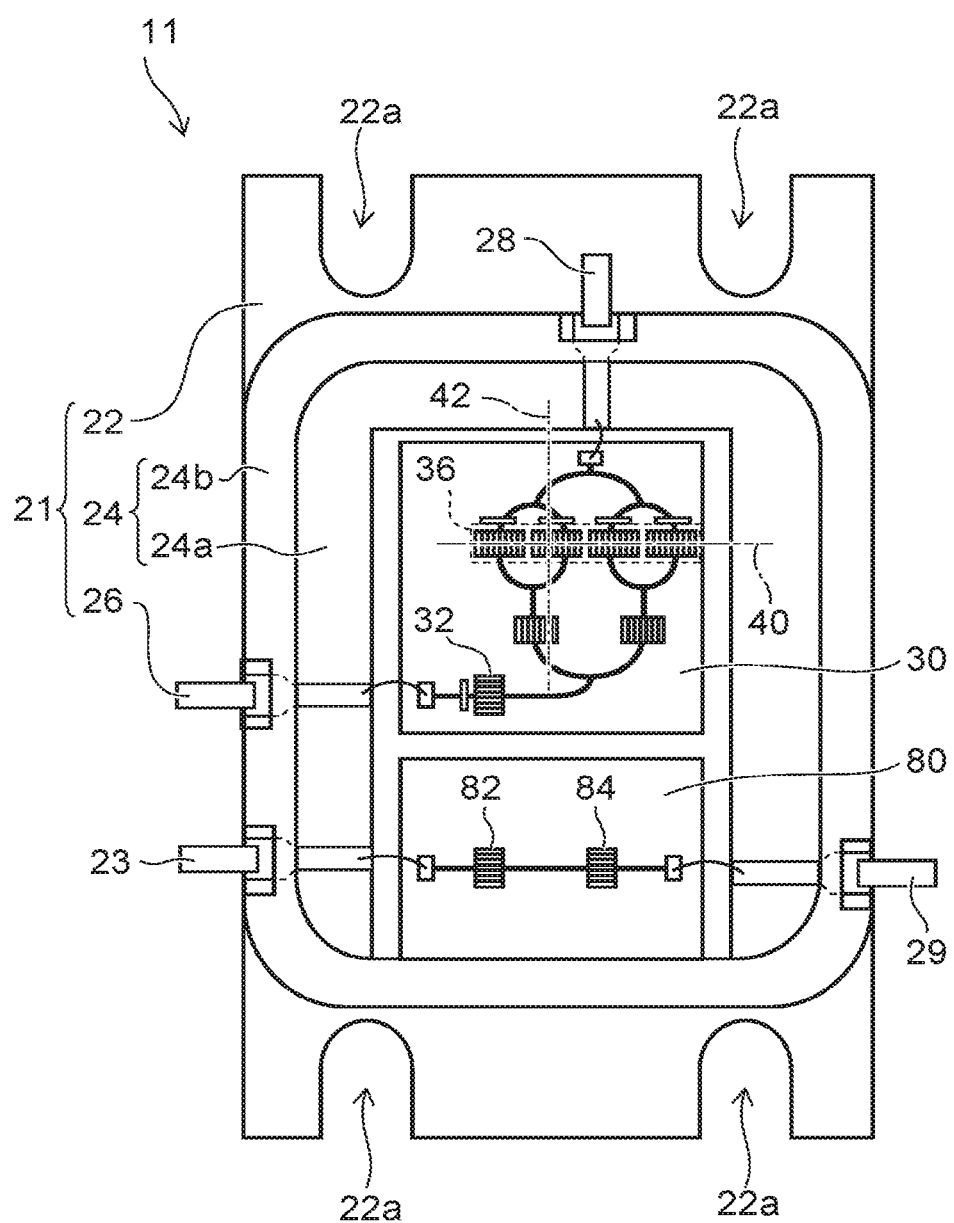
FIG. 5 is a schematic plan view of a high frequency semiconductor amplifier according to a third embodiment.

In general, according to one embodiment, a high frequency semiconductor amplifier includes a package base part, and a monolithic microwave integrated circuit. The package base part includes a metal plate provided with an attachment hole, a frame body bonded to the metal plate and provided with an opening, a first lead part bonded to the frame body, and a second lead part bonded to the frame body. The monolithic microwave integrated circuit is provided with a first amplification element having a plurality of finger electrodes and a second amplification element in which a plurality of cell regions having a plurality of finger electrodes are arranged along a first line. The second amplification element is connected at a subsequent stage of the first amplification element. The monolithic microwave integrated circuit is bonded to the metal plate in the opening. An input electrode of the first amplification element is connected to the first lead part. And an output electrode of the second amplification element is connected to the second lead part via an output combiner. Each finger electrode of the second amplification element is generally orthogonal to the first line. Each finger electrode of the first amplification element is generally parallel to the first line. The attachment hole of the metal plate is provided in a region lying along a second line generally orthogonal to the first line and protruding outside the frame body.

Embodiments of the invention will now be described with reference to the drawings.

FIG. 1A is a schematic plan view of a high frequency semiconductor amplifier according to a first embodiment. FIG. 1B is a schematic sectional view taken along line A-A. FIG. 1C is a schematic front view.

The high frequency semiconductor amplifier 10 includes a package base part 20 and a monolithic microwave integrated circuit (MMIC) 30.

The package base part 20 includes a metal plate 22 provided with an attachment hole 22a, a frame body 24 bonded to the metal plate 22 and provided with an opening 24c, a first lead part 26 bonded to the frame body 24, and a second lead part 28 bonded to the frame body 24.

The monolithic microwave integrated circuit 30 includes a first amplification element 32 and a second amplification element 36. The first amplification element 32 has a plurality of finger electrodes F32. The second amplification element 36 is connected at a subsequent stage of the first amplification element 32. In the second amplification element 36, a plurality of cell regions 36a-36d having a plurality of finger electrodes F36 are arranged along a first line 40. The monolithic microwave integrated circuit 30 is bonded to the metal plate 22 in the opening 24c. The input electrode 37 of the first amplification element 32 is connected to the first lead part 26. The output electrode 38 of the second amplification element 36 is connected to the second lead part 28 via an output combiner 39. The output combiner 39 may be a microstrip line combiner. The first lead part 26 and the second lead part 28 extend along the direction parallel to the first line 40.

Each finger electrode F36 of the second amplification element 36 is generally orthogonal to the first line 40. Each finger electrode F32 of the first amplification element 32 is generally parallel to the first line 40. The attachment hole 22a of the metal plate 22 lies along a second line 42 generally orthogonal to the first line 40 and is provided in a region of the metal plate 22 protruding outside the frame body 24.

In this specification, the statement of being generally orthogonal means that the crossing angle is not less than 80 degrees and not more than 100 degrees. The statement of being generally parallel means that the absolute value of the crossing angle is not more than 10 degrees.

The amplification element may be HEMT (high electron mobility transistor) or MESFET (metal semiconductor field effect transistor). In this case, the gate fingers can be used as input electrodes, and the drain fingers can be used as output electrodes. They can be respectively bundled and connected to pad electrodes. The finger sources can be bundled and grounded via e.g. a through hole.

The metal plate 22 can be made of e.g. CuW, CuMo, MoW, Cu, Mo, CuMo composite, or Cu/Mo/Cu laminate.

The frame body 24 includes a first layer 24a made of ceramic such as $Al_2O_3$ and a second layer 24b made of ceramic such as $Al_2O_3$. After a conductive layer made of e.g. a thick film is provided on the surface, the first layer 24a and the second layer 24b are sintered. The sintered frame body 24 is brazed to the metal plate 22 and to the first and second lead parts 26, 28 with e.g. silver brazing alloy (having a melting point of e.g. 780-900° C.).

The first amplification element 32 and the second amplification element 36 can be e.g. HEMT. MMIC is configured by forming e.g. HEMT, MIM (metal-insulator-metal) capacitor, inductance, and microstrip line on a substrate of e.g. SiC, GaN, or sapphire. The MMIC chip is bonded to the metal plate 22 with e.g. AuSn solder (having a melting point of approximately 280° C.). The HEMT is made of a nitride-based compound semiconductor layer provided on the substrate.

In FIG. 1A, the output-side line of the first amplification element 32 is bent by generally 90 degrees and then bifurcated. Each branch is amplified by a third amplification element 34 and further bifurcated. Thus, the second amplification element 36 includes four cell regions (36a-36d). The output electrodes (e.g. drain electrodes) of the four cell regions are combined and further combined by the output combiner 39. Thus, the output combiner 39 suppresses phase shift, and the four cell regions operate uniformly.

The substrate of the MMIC 30 has lower thermal conductivity than metal. Thus, most of the heat generated in the four cell regions 36a-36d spread horizontally in the MMIC to the metal plate 22. In the first embodiment, the heat dissipation path H1 directed in the direction generally orthogonal to the first line 40 with shorter distance to the metal plate 22 has a short and uniform distance. This can reduce the thermal resistance of the chip portion of the MMIC 30.

The input electrode 37 of the first amplification element 32 is connected to the first lead part 26 via an input pad electrode 30a of the MMIC with e.g. a bonding wire. The signal level of the first amplification element 32 is low. Thus, the amount of heat generation is small. Accordingly, the degradation of output performance is small even if the finger electrode F32 is parallel to the first line 40.

The output pad electrode 30b of the MMIC 30 is placed on the attachment hole 22a side of the metal plate 22. The second lead part 28 is provided preferably along the first line 40 to facilitate connection to an external circuit.

FIG. 2 is a schematic plan view of a high frequency semiconductor amplifier according to a comparative example.

The high frequency semiconductor amplifier 110 includes a package base part 120 and a monolithic microwave integrated circuit (MMIC) 130.

The package base part 120 includes a metal plate 122 provided with an attachment hole 122a, a frame body 124 provided with an opening 124c, a first lead part 126 bonded to the frame body 124, and a second lead part 128 bonded to the frame body 124.

The MMIC 130 includes a first amplification element 132 and a second amplification element 136. The first amplification element 132 has a plurality of finger electrodes. The second amplification element 136 is connected at a subsequent stage of the first amplification element 132. In the second amplification element 136, a plurality of cell regions having a plurality of finger electrodes are arranged along a second line 142. The MMIC 130 is bonded to the metal plate 122 in the opening 124c. The input electrode 137 of the first amplification element 132 is electrically connected to the first lead part 126. The output electrode 138 of the second amplification element 136 is electrically connected to the second lead part 128 via an output combiner 139.

Each finger electrode of the second amplification element 136 is provided generally orthogonal to the second line 142. Each finger electrode of the first amplification element 132 is parallel to each finger electrode of the second amplification element 136. The attachment hole 122a of the metal plate 122 lies along a line parallel to the second line 142 and is provided in a region of the metal plate 122 protruding outside the frame body 124.

In the comparative example, the first amplification element 132 and the second amplification element 136 are placed in generally horizontal symmetry across a common line 144. That is, they are placed along a line connecting the first lead part 126 and the second lead part 128. Thus, the MMIC 130 is shaped like a rectangle in which the length between the first lead part 126 and the second lead part 128 is larger than the other length. There is a large difference between the linear expansion coefficient of ceramic and the linear expansion coefficient of metal such as Cu. Thus, the package base part 120 is prone to warpage after assembly. This increases thermal resistance between the heat sink (not shown) and the metal plate 122. Furthermore, among the heat dissipation paths H2 of heat generated in the four cell regions, the distance traversed in the MMIC 130 is not uniform and is longer than that of the first embodiment. This increases thermal resistance in the MMIC chip.

In contrast, in the first embodiment, the interstage interconnect part between the first amplification element 32 and the second amplification element 36 is bent in a generally orthogonal configuration. Thus, the MMIC 30 can be shaped like a square. This can reduce the warpage of the package base part 20 and enhance the bonding strength. Furthermore, the package base part 20 can be brought into tight contact with the heat sink. This can reduce external thermal resistance. Furthermore, the heat generation parts of the multi-cell regions 36a-36d of the second amplification element 36 are dispersed along the first line 40. Thus, heat spreads generally uniformly in the direction orthogonal to the first line 40 and is externally dissipated across a short distance via the metal plate 22 and the heat sink.

FIG. 3 is a schematic perspective view in which the package base part is bonded to a lid part.

An upper surface conductive layer 24f may be provided on the upper surface of the frame part 24 made of ceramic. A metal or metallized lid part 70 may be bonded thereto with e.g. AuSn solder. This can improve the hermeticity inside the package. The package may be attached to a heat sink (not shown) made of metal with e.g. screws. This can reduce external thermal resistance.

FIG. 4A is a schematic plan view of a high frequency semiconductor amplifier according to a second embodiment. FIG. 4B is a schematic sectional view taken along line A-A. FIG. 4C is a schematic front view.

The high frequency semiconductor amplifier 10 includes a package base part 20 and an MMIC 30.

The frame body 24 includes a first layer 24a bonded to a metal plate 22, a second layer 24b bonded to the first layer 24a, a first conductive layer 24d provided on the first layer 24a and connected to a first lead part 26, and a second conductive layer 24e provided on the first layer 24a and connected to a second lead part 28.

The first conductive layer 24d includes a transmission line generally orthogonal to a first line 40. The second conductive layer 24e includes a transmission line generally orthogonal to the first line 40. The first lead part 26 and the second lead part 28 are included in a common line 44.

The first layer 24a and the second layer 24b are made of e.g. $Al_2O_3$ and have an equal thickness. An upper surface conductive layer 24f is provided on the upper surface of the second layer 24b. The upper surface conductive layer 24f is connected to the metal plate 22 via e.g. a conductive layer provided on the frame body 24. Here, the first conductive layer 24d and the second conductive layer 24e constitute strip lines with the metal plate 22 and the upper surface conductive layer 24f. For instance, the external load is set to 50Ω. Then, the width of the conductive layer, the thickness of $Al_2O_3$, and the thickness of the conductive layer, for instance, can be determined so that the characteristic impedance of the transmission line is 50Ω±10%.

The MMIC 30 with the input/output impedance designed to 50Ω is bonded to the package base part 20, and the lid part 70 is grounded. Then, the first lead part 26 can be matched with the power supply impedance of 50Ω, and the second lead part 28 can be matched with the load impedance of 50Ω. The placement of the first lead part 26 and the second lead part 28 on the common line 44 facilitates arrangement in the wireless equipment housing.

FIG. 5 is a schematic plan view of a high frequency semiconductor amplifier according to a third embodiment.

The high frequency semiconductor amplifier 11 includes a transmission MMIC (high output amplifier) 30 and a reception MMIC (low noise amplifier) 80 in a package base part 21. The transmission MMIC 30 is the same as the MMIC of the first embodiment shown in FIGS. 1A to 1C.

A low noise amplification element 82 such as HEMT is provided in the initial stage of the reception MMIC 80. In the low noise amplifier, the operation current minimizing noise is low. Thus, the power consumption is also low. On the other hand, the transmission MMIC 30 has high output. Thus, it is operated at high current, and the power consumption (i.e. amount of heat generation) is high. Accordingly, the temperature increase of the reception MMIC 80 due to heat generated in the transmission MMIC 30 results in gain decrease and the degradation of high frequency characteristics such as NF.

In the high frequency semiconductor amplifier 11 of the third embodiment, the multi-cell regions of the second amplification element 36 in the final stage of the transmission MMIC 30 are placed along the first line 40. Thus, the distance from the respective multi-cell regions to the outer edge of the MMIC can be made generally uniform and short. This reduces the temperature increase of the reception MMIC 80 and suppresses the gain decrease and the degradation of high frequency characteristics such as NF.

The first to third embodiments provide a high frequency semiconductor amplifier in which the heat dissipation performance from the high output amplification element is improved. Such high frequency semiconductor amplifiers can be widely used for radar devices and communication equipment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A high frequency semiconductor amplifier comprising:
   a package base part including a metal plate provided with attachment holes, a frame body bonded to the metal plate and provided with an opening, a first lead part bonded to the frame body, and a second lead part bonded to the frame body; and
   a monolithic microwave integrated circuit including a first amplification element having a plurality of finger electrodes, a second amplification element in which a plurality of cell regions having a plurality of finger electrodes are arranged along a first line, an output combiner, and an output pad electrode, the second amplification element being connected at a subsequent stage of the first amplification element, output finger electrodes of the plurality of the finger electrodes of the second amplification element being connected to output electrodes of the second amplification element, the output electrodes of the second amplification element being connected to one end portion of the output combiner, another end portion of the output combiner being connected to the output pad electrode, the monolithic microwave integrated circuit being bonded to the metal plate in the opening, an input electrode of the first amplification element being connected to the first lead part, and the output pad electrode being connected to the second lead part, wherein
   each finger electrode of the second amplification element is generally orthogonal to the first line,
   each finger electrode of the first amplification element is generally parallel to the first line,
   the attachment holes of the metal plate are provided in a region lying along a second line generally orthogonal to the first line and protruding outside the frame body, and
   a distance is kept uniform between an outer edge of each cell region and an outer edge of the monolithic microwave integrated circuit on a side of one of the attachment holes.

2. The amplifier according to claim 1, wherein the first lead part and the second lead part extend along a direction parallel to the first line.

3. The amplifier according to claim 1, wherein
   the frame body includes a first layer bonded to the metal plate, a second layer bonded to the first layer, a first conductive layer provided on the first layer and connected to the first lead part, and a second conductive layer provided on the first layer and connected to the second lead part,
   the first conductive layer includes a transmission line generally orthogonal to the first line,
   the second conductive layer includes a transmission line generally orthogonal to the first line, and
   the first lead part and the second lead part are included in a common line.

4. The amplifier according to claim 2, wherein
   the frame body includes a first layer bonded to the metal plate, a second layer bonded to the first layer, a first conductive layer provided on the first layer and connected to the first lead part, and a second conductive layer provided on the first layer and connected to the second lead part,
   the first conductive layer includes a transmission line generally orthogonal to the first line,
   the second conductive layer includes a transmission line generally orthogonal to the first line, and
   the first lead part and the second lead part are included in a common line.

5. The amplifier according to claim 1, wherein the first layer and the second layer of the frame body include ceramic, respectively.

6. The amplifier according to claim 2, wherein the first layer and the second layer of the frame body include ceramic, respectively.

7. The amplifier according to claim 3, wherein the first layer and the second layer of the frame body include ceramic, respectively.

8. The amplifier according to claim 4, wherein the first layer and the second layer of the frame body include ceramic, respectively.

9. The amplifier according to claim 1, wherein the monolithic microwave integrated circuit includes a substrate containing one of SiC, GaN, and sapphire, and a compound semiconductor layer provided on the substrate.

10. The amplifier according to claim 2, wherein the monolithic microwave integrated circuit includes a substrate containing one of SiC, GaN, and sapphire, and a compound semiconductor layer provided on the substrate.

11. The amplifier according to claim 3, wherein the monolithic microwave integrated circuit includes a substrate containing one of SiC, GaN, and sapphire, and a compound semiconductor layer provided on the substrate.

12. The amplifier according to claim 4, wherein the monolithic microwave integrated circuit includes a substrate containing one of SiC, GaN, and sapphire, and a compound semiconductor layer provided on the substrate.

13. The amplifier according to claim 5, wherein the monolithic microwave integrated circuit includes a substrate containing one of SiC, GaN, and sapphire, and a compound semiconductor layer provided on the substrate.

14. The amplifier according to claim 6, wherein the monolithic microwave integrated circuit includes a substrate containing one of SiC, GaN, and sapphire, and a compound semiconductor layer provided on the substrate.

15. The amplifier according to claim 7, wherein the monolithic microwave integrated circuit includes a substrate containing one of SiC, GaN, and sapphire, and a compound semiconductor layer provided on the substrate.

16. The amplifier according to claim 8, wherein the monolithic microwave integrated circuit includes a substrate containing one of SiC, GaN, and sapphire, and a compound semiconductor layer provided on the substrate.

* * * * *